(12) United States Patent
Zhu et al.

(10) Patent No.: US 11,114,820 B2
(45) Date of Patent: Sep. 7, 2021

(54) PUSH-PULL CIRCUIT WITH DRIVING ASSISTED BY ASYMMETRIC CHARGE SHARING

(71) Applicant: HEWLETT PACKARD ENTERPRISE DEVELOPMENT LP, Houston, TX (US)

(72) Inventors: Zhubiao Zhu, Ft. Collins, CO (US); Clinton Harold Parker, Ft. Collins, CO (US); Daniel Alan Berkram, Ft. Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 87 days.

(21) Appl. No.: 16/186,822

(22) Filed: Nov. 12, 2018

(65) Prior Publication Data

US 2020/0153201 A1 May 14, 2020

(51) Int. Cl.
| | | |
|---|---|---|
| H01S 5/042 | (2006.01) |
| H01S 3/13 | (2006.01) |
| H01S 5/183 | (2006.01) |
| H04B 10/508 | (2013.01) |
| H05B 45/32 | (2020.01) |

(52) U.S. Cl.
CPC .......... *H01S 5/0428* (2013.01); *H01S 3/1305* (2013.01); *H01S 5/183* (2013.01); *H04B 10/508* (2013.01); *H05B 45/32* (2020.01)

(58) Field of Classification Search
None
See application file for complete search history.

(56) References Cited

U.S. PATENT DOCUMENTS

| | | | |
|---|---|---|---|
| 7,659,535 B2 | 2/2010 | Bozso et al. | |
| 9,263,854 B2 | 2/2016 | Raj et al. | |
| 2001/0028665 A1* | 10/2001 | Stronczer | H01S 5/0427 372/38.02 |
| 2003/0052250 A1* | 3/2003 | Taguchi | H01S 5/042 250/205 |
| 2012/0294324 A1* | 11/2012 | Miyajima | H01S 5/0428 372/38.02 |
| 2018/0302070 A1* | 10/2018 | Parvizi | H03K 5/13 |

OTHER PUBLICATIONS

Ohhata, K. et al.; "17 Gb/s VCSEL driver using double-pulse asymmetric emphasis technique in 90-nm CMOS for optical interconnection"; May 2010; 5 pages.
Sialm, G., et al; "Design of Low-Power Fast VCSEL Drivers for High-Density Links in 90-nm SOI CMOS"; Jan. 2006; 10 pages.
Zeng, Z. et al.; "A Compact Low-Power Driver Array for VCSELs in 65-nm CMOS Technology" May 8, 2017; 6 pages.

(Continued)

*Primary Examiner* — Tod T Van Roy
(74) *Attorney, Agent, or Firm* — Sheppard Mullin Richter & Hampton LLP

(57) ABSTRACT

A push-pull circuit for an opto-electronic device includes: an output node; a pull-up circuit that, in operation, controls a falling edge rate of an input signal to the opto-electronic device while sharing charge with the output node; and a pull-down circuit that, in operation, controls a rising edge rate of the input signal to the opto-electronic device while sharing charge with the output node.

14 Claims, 4 Drawing Sheets

(56) References Cited

OTHER PUBLICATIONS

Belfiore at al., "A 50 Gb/s 190 mW Asymmetric 3-Tap FFE VCSEL Driver", available online at <https://www.semanticscholar.org/paper/A-50-Gb%2Fs-190-mW-Asymmetric-3-Tap-FFE-VCSEL-Driver-Belfiore-Khafaji/08bc66a1b6d43b81480d3e60a226a0e978da1228>, abstract, IEEE Journal of Solid-State Circuits, vol. 52, Issue 9, Sep. 2017, 4 pages.

Yazaki et al., "25-Gbps×4 optical transmitter with adjustable asymmetric pre-emphasis in 65-nm CMOS", 2014 IEEE International Symposium on Circuits and Systems (ISCAS), 2014, pp. 2692-2695.

\* cited by examiner

PUSH-PULL CIRCUIT WITH DRIVING ASSISTED BY ASYMMETRIC CHARGE SHARING

This invention was made with Government support under Prime Contract No. DE-AC52-07NA27344 awarded by DOE. The Government has certain rights in this invention.

BACKGROUND

Opto-electronic devices, and particularly vertical-cavity surface-emitting lasers ("VCSELs"), that are symmetrically driven yield an output signal in which the falling edge rate is lower than the rising edge rate. This phenomenon adversely affects the signal quality of the opto-electronic device in some applications. For example, electrical and optical link migration employs serial interfaces operating at increasing data rates. Low bandwidth is especially an issue at high bit rates, or with high input/output ("IO") capacitance loads such as drivers for opts-electronic devices like a VCSEL. Such an application would benefit from increasing the bandwidth which is especially an issue at high bit rates, or with high IO capacitance loads like some VCSEL PAM4 driver which requires equalization to remove VCSEL ringing and high impedance issues.

BRIEF DESCRIPTION OF THE DRAWINGS

Examples described herein may be understood by reference to the following description taken in conjunction with the accompanying drawings, in which like reference numerals identify like elements.

While examples described herein are susceptible to various modifications and alternative forms, the drawings illustrate specific examples herein described in detail by way of example. It should be understood, however, that the description herein of specific examples is not intended to be limiting to the particular forms disclosed, but on the contrary, the intention is to cover all modifications, equivalents, and alternatives falling within the spirit and scope of the examples described herein and the appended claims.

DETAILED DESCRIPTION

Illustrative examples, of the subject matter claimed below will now be disclosed. In the interest of clarity, not all features of an actual implementation are described in this specification. It will be appreciated that in the development of any such actual example, numerous implementation-specific decisions will be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

One characteristic of VCSELs is that the fall time is longer than the rise time. This phenomenon is mainly due to charge storage in the VCSEL. This problem can be mitigated using an asymmetric charge sharing design as provided herein. The present disclosure provides a push-pull circuit for an opto-electronic device that drives the opto-electric device asymmetrically by controlling the rising edge rate or the falling edge rate of the input signal. The push-pull circuit also shares charge with an output node in the course of its operation. This is referred to in a general sense as "driving assisted by charge sharing".

Figure 1:
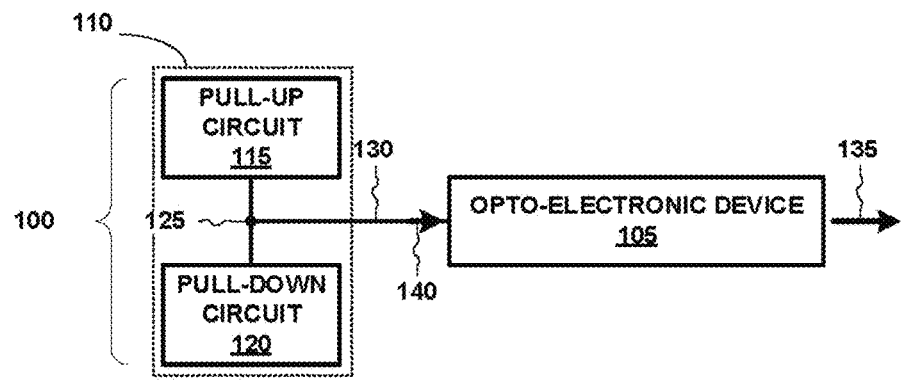
FIG. 1 is a block diagram of a driver circuit and an opto-electronic device in one particular example.

FIG. 1 schematically depicts in a simplified fashion a driver circuit 100 and an opto-electronic device 105 in one particular example. More particularly, in the example of FIG. 1, the driver circuit 100 is a link optical driver and the opto-electronic device 105 is a VCSEL. The examples illustrated herein all employ a VCSEL as the opto-electronic device 105 but it is to be understood that the opto-electronic device 105 may be an opto-electronic device other than a VCSEL in other examples not shown.

The driver circuit 100 includes a push-pull circuit 110 that, in turn, includes a pull-up circuit 115 and a pull-down circuit 120. In some examples, the pull-up circuit 115 provides current sourcing of the opto-electronic device—that is, it provides the "push" in the push-pull. In some examples, the pull-down circuit 120 provides current sinking—such that it provides the "pull" in the push-pull. The pull-up circuit 115 and the pull-down circuit 120 share charge with the opto-electronic device 105 in a manner described more fully below through a output node 125.

The push-pull circuit 110 asymmetrically drives the opto-electronic device 105 through the output node 125 and over line 130 to equalize the output signal 135 from the opto-electronic device 105. To do so, the pull-up circuit 115, in operation, controls a falling edge rate of an input signal 140 to the opto-electronic device 105 while sharing charge with the output node 125. The pull-down circuit 120, in operation, controls a rising edge rate of the input signal 140 to the opto-electronic device 105 while sharing charge with the output node 125.

The rising and falling edge rates of the input signal 140 may therefore differ by controlling at least one of the rising edge rate or the falling edge rate of the input signal via the pull-down circuit 120 or the pull-up circuit 115. The input signal 140 is consequently "asymmetric" such that the optoelectronic device 105 is "asymmetrically driven". This difference in input rising and falling edge rates produces equal rising and falling edge rates in the output signal 135. The output signal 135 is therefore "equalized". This equalization in the output signal mitigates ringing and high impedance issues discussed above.

Figure 2:
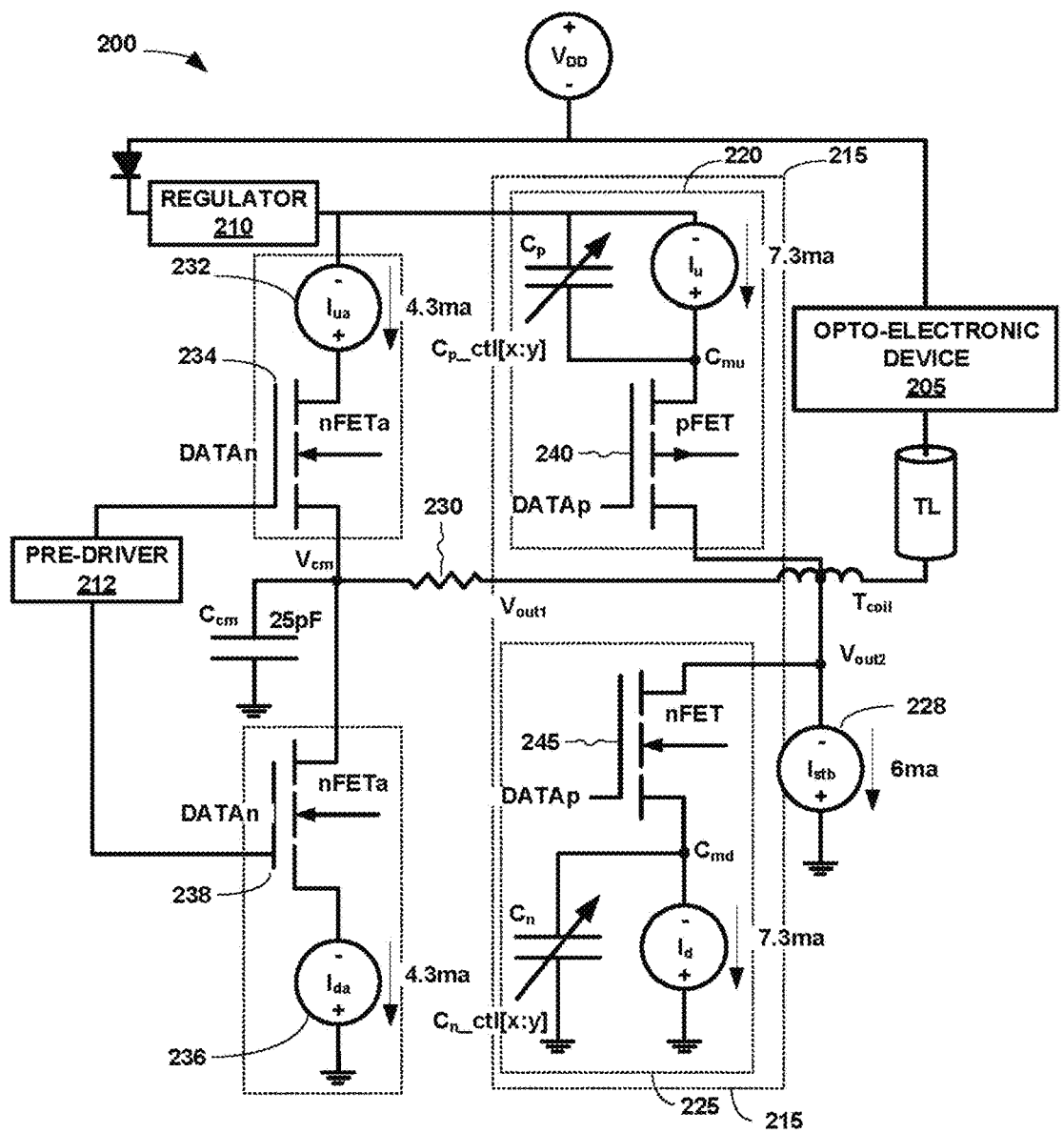
FIG. 2 schematically depicts a driver circuit and an opto-electronic device in one particular example.

Those in the art having the benefit of this disclosure will appreciate that the driver circuit 100 in FIG. 1 is greatly simplified. FIG. 2 shows in greater detail one particular example of a driver circuit in accordance with the subject matter claimed below. FIG. 2 shows a driver circuit 200 for an opto-electronic device 205. Again, the opto-electronic device 205 is a VCSEL but the subject, matter claimed below is not limited to VCSELs.

The driver circuit 200 includes a regulator 210, a pre-driver 212, and a push-pull circuit 215. The push-pull circuit 215 includes a pull-up circuit 220 and a pull-down circuit 225. The driver circuit 200 also includes a transmission line TL. The driving current, for the opto-electronic device 205 may be transmitted from the push-pull circuit 215 over the transmission line TL through the output node $V_{out2}$. Source $V_{DD}$ provides a bias for the regulator 210 and the opto-electronic device 205 while regulator 210 operates as a protection for the source $V_{DD}$. The pre-driver 212 drives the switches 240, 245 by generating the control signal $DATA_P$. The current source 228 provides a DC bias current for the opto-electronic device 205.

Some of the details in FIG. 2 are implementation specific and may be omitted or altered in other examples. For example, the capacitor $C_{cm}$ connects the termination resistor 230 to ground for establishing a correct common mode termination voltage at node $V_{cm}$ and stabilization. $C_{cm}$ holds the voltage on the left-hand side of the termination resistor 230 so that $V_{cm}$ appears to originate from a voltage source. The auxiliary current source $I_{ua}$ (controlled by the switch 234) and the auxiliary current sink $I_{ua}$ (controlled by the switch 238) assist in this function. The auxiliary current source $I_{ua}$ and auxiliary current sink $I_{da}$, as well as their associated switches 234, 238, may be omitted in some examples if the capacitance value of $C_{cm}$ is raised to a sufficiently high value. The inductor $T_{coil}$ is also optional and may be omitted in some examples. In these embodiments, the transmission line TL may be connected directly to the $V_{out2}$ node. So may the termination resistor 230.

Still referring to FIG. 2, the pull-up circuit 220 includes a capacitor $C_p$ in parallel with a current source $I_u$, the combination of which is in series with the switch 240. The switch 240 controls the contribution of the current source $I_u$ and capacitor $C_p$ to the driving current for the opto-electronic device 205. Similarly, the pull-down circuit 225 includes a capacitor $C_n$ in parallel with a current sink $I_d$ and the combination of the capacitor $C_n$ and the current sink $I_d$ is in series with the switch 245. The switch 245 controls the contribution of the current sink $I_d$ and the capacitor $C_n$ to the driving current, for the opto-electronic device 205. The pull-up circuit 220 and the pull-down circuit 225 together produce the driving current for the opto-electronic device 205 that is delivered through the node $V_{out2}$, the inductor $T_{coil}$ and the transmission line TL.

As described above, one characteristic of VCSELs, such as the opto-electronic device 205, is that the fall time is longer than the rise time in the laser signal that it outputs. This phenomenon is mainly due to charge storage in the VCSEL. When the fall time is slower because of symmetric driving, signal quality is adversely impacted. To solve, or at least mitigate, this problem, the pull-up current going through the switch 240 in FIG. 2 should be higher at an earlier time after the switch 240 turns on than it should be later while the switch 240 is on. Similarly, the pull-down current through the switch 245 in FIG. 2 should be higher after the switch 245 turns on than it should be later after the switch 240 has been on for some time. The timing and magnitude of this decrease over time in the pull-up and pull-down currents will depend on a number of implementation specific factors such as the relative speed of the process (FAST, SLOW, etc.), temperature and voltage. Other factors may be implicated in other examples as well in an implementation specific manner.

This can be accomplished by using a larger pull-up charge sharing capacitor $C_p$ relative to pull-down charge sharing capacitor $C_n$, e.g., $C_p > C_n$. The pull-down charge sharing capacitor $C_n$ is controlled by a control signal $C_n\_ctl[x:y]$ and the pull-up charge sharing capacitor is $C_p$ is controlled by a control signal $C_p\_ctl[x:y]$. The different capacitor values for $C_p$ and $C_n$ can be obtained by selecting different $C_p\_ctl[x:y]$ and $C_n\_ctl[x:y]$ values or the same value with different capacitor sizes. The illustrated example selects different capacitor values by selecting a different control value in the control signals $C_p\_ctl[x:y]$, $C_n\_ctl[x:y]$.

Figure 3:
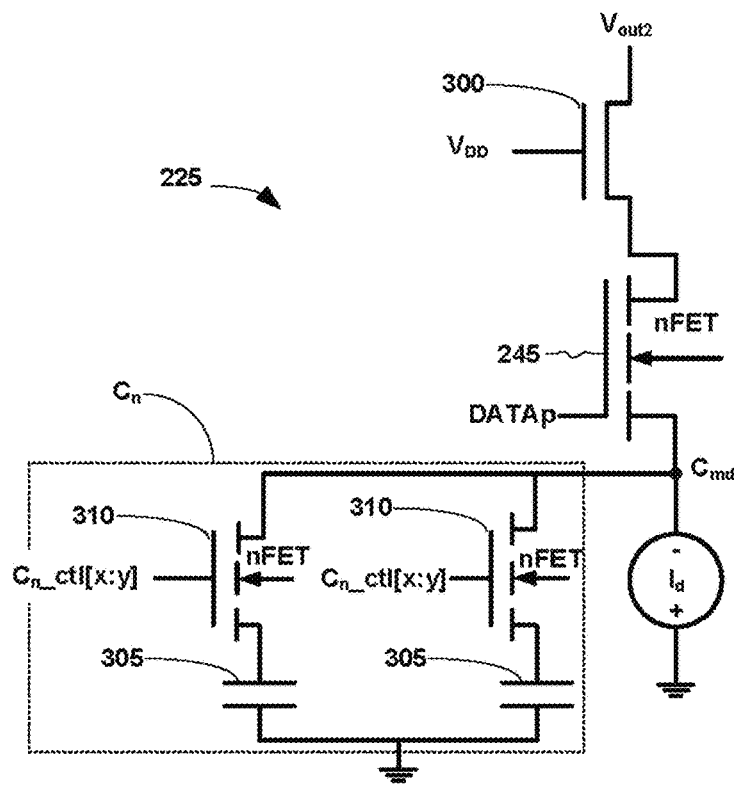
FIG. 3 illustrates a pull-down circuit that is a part of the driver circuit of FIG. 2 in greater detail.

FIG. 3 illustrate one example of the pull-down circuit 225 that is a part of the driver circuit 200 of FIG. 2, and more particularly a part of the push-pull circuit 215, in greater detail. FIG. 3 shows the current sink $I_d$, the switch 245, and variable capacitor $C_n$. The switch 245 is a negative channel Field Effect Transistor ("nFET"). There is an additional switch in FIG. 3 that is not shown in FIG. 2 for the sake of clarity. The opto-electronic component 205, shown in FIG. 2, is always on and the switch 300 protects the pull-down circuit 225 from overvoltage. The variable capacitor $C_n$ includes a plurality of capacitors 305 in parallel that are switched into and out of the circuit by the respective switches 310. The switches 310 are controlled by the control signal $C_n\_ctl[x:y]$. In this example, there are two capacitors 305, but this number may vary in accordance with considerations discussed further below.

When the control signal $DATA_P$ is logic 0, the switch 245 is off and the node $C_{md}$ is discharged to 0. When the $DATA_P$ is turned on, initially there is big (bigger than the steady state current) current flow from $V_{out2}$ to charge the node $C_{md}$ to a steady state voltage value. This extra charge moving from $V_{out2}$ to the node $C_{md}$ is called driving assisted by charge sharing. The amount of extra charge required to charge the node $C_{md}$ to a steady state value is dependent on the capacitance on the node $C_{md}$. The higher the capacitance on the node $C_{md}$, the higher the extra charge removed from the $V_{out2}$ or vice versa. The control signal $C_n\_ctl[x:y]$ controls the strength of the charge sharing from the pull-down circuit 225.

Figure 4:
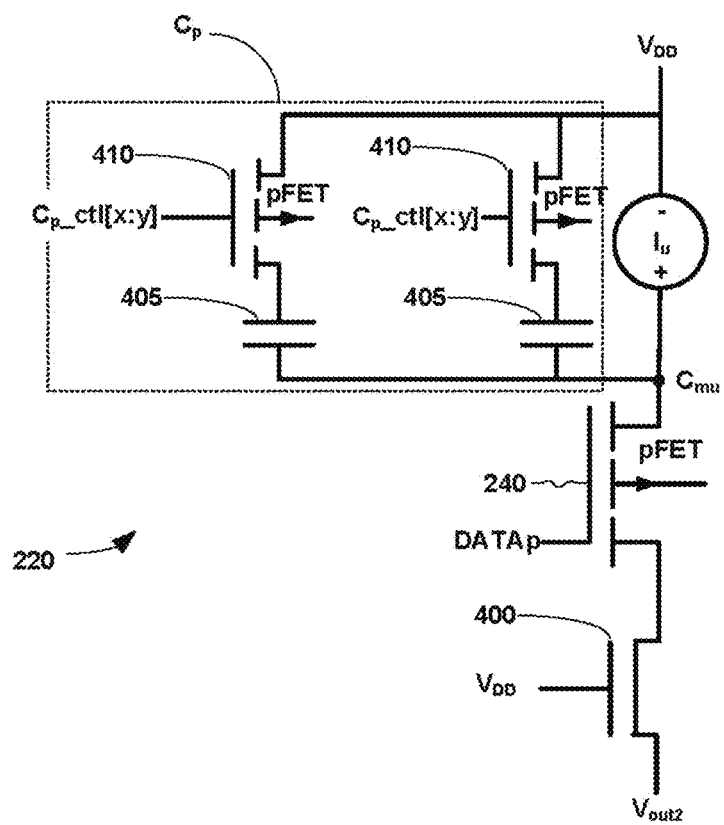
FIG. 4 illustrates a pull-Lip circuit that is a part of the driver circuit of FIG. 2 in greater detail.

FIG. 4 illustrate one example of the pull-up circuit 220 that is a part of the driver circuit 200 of FIG. 2, and more particularly a part of the push-pull circuit 215, in greater detail. FIG. 4 shows the current source $I_u$, the switch 240, and variable capacitor $C_p$. The switch 240 is a positive channel Field Effect Transistor ("pFET"). There is an, additional switch in FIG. 4 that is not shown in FIG. 2 for the sake of clarity. The opts electronic component 205, shown in FIG. 2, is always on and the switch 400 protects the pull-up circuit 220 from overvoltage. The variable capacitor $C_p$ includes a plurality of capacitors 405 in parallel that are switched into and out of the circuit by the respective switches 410. The switches 410 are controlled by the control signal $C_p\_ctl[x:y]$. In this example, there are two capacitors 405, but this number may vary in accordance with considerations discussed further below.

When the control signal $DATA_P$ is logic 1, the switch 245 is off and the node $C_{mu}$ is is charged to the output of the regulator 210, shown in FIG. 2. When the $DATA_P$ is turned on, initially there is a larger than the steady state current flowing from $V_{out2}$ to charge the node $C_{mu}$ to a steady state voltage value. This extra charge moving from $V_{out2}$ to the node $C_{mu}$ is called driving assisted by charge sharing. The amount of extra charge used to charge the node $C_{mu}$ to a steady state value is dependent on the capacitance on the node $C_{mu}$. The higher the capacitance on the node $C_{mu}$, the higher the extra charge removed from the $V_{out2}$ or vice versa. The signals $C_p\_ctl[x:y]$ control the strength of the charge sharing from the pull-up circuit 220.

In the illustrated example, the control signals $C_p\_ctl[x:y]$, $C_n\_ctl[x:y]$ include two select bits for each respective charge sharing capacitor $C_p$, $C_n$. Thus, $C_p\_ctl[x:y]=SEL_p<x:y>$ and $C_n\_ctl[x:y]=SEL_n<x:y>$ where x is either a logic 0 or a logic 1 and y is either a logic 0 or a logic 1. Each select bit x, y controls one of the switches 310, 410 to add capacitance to the node $C_{mu}$ and $C_{md}$. There are four possible combinations for each of $C_p\_ctl[x:y]$, On ctl[x:y] that can be selected in which x and y are both off, bit x on and bit y off, bit x off and bit y on, or both on, Assuming that the capacitors 305, 405 and the switches 310, 410 are not the same size, that represents four possible capacitance values in each of the pull-up circuit 215 and the pull-down circuit 225. Those values are zero, the capacitance value of the first capacitor, the capacitance of the second capacitor, or the sum of the capacitance values of the first and second capacitors.

Other examples may use different numbers of capacitors with different numbers of select bits. For instance, three capacitors and three select bits could be used to create eight possible capacitance values. This may be useful where one might want to use more numbers of bits/capacitors in order to provide more degrees of freedom in, for example, smaller capacitance step sizes or larger ranges of capacitances.

The control signals $C_p\_ctl[x:y]$, $C_n\_ctl[x:y]$ are, in the illustrated example, programmable. The subject matter claimed below admits wide variation in how this programming may be implemented. Two examples of how the programmable aspects of the pull-down circuit of FIG. 3 and the pull-up circuit of FIG. 4 may be implemented are shown in FIG. 5A and FIG. 5B.

Figure 5A:
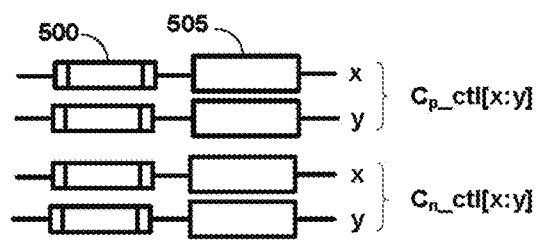
FIG. 5A and FIG. 5B illustrate how the control signals of the driver circuit in FIG. 2 may be programmed in two different examples.

In one example, shown in FIG. 5A, the values of the select bits x and y are determined by fuses 500 (only one indicated) and are loaded into registers 505 (only one indicated). More particularly, the driver circuit 200 and the opto-electronic device 205, both shown in FIG. 2, are fabricated into a single device not otherwise shown. The fuses 500 and registers 550 are also fabricated as a part of this device. The fuses 500 may be programmed using, techniques similar to those used in programming an Electrically Erasable Programmable Memory ("EEPROM"). The values determined by the fuses 500 are then loaded into the registers 505 whenever the driver circuit 100 and opto-electronic device 135 are started up.

Figure 5B:
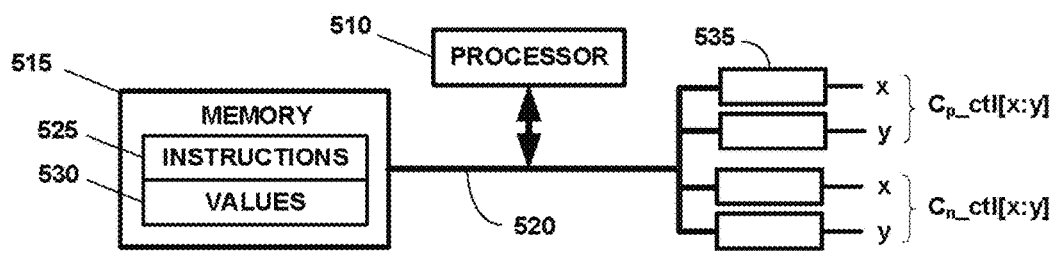

FIG. 5B illustrates a processor 510 and an associated memory 515 with which the programmable aspects of the pull-down circuit 225 of FIG. 3 and the pull-up circuit 220 of FIG. 4 may be implemented in some examples. The processor 510 may be any suitable kind of processor including, for instance, a micro-controller. The memory 515 may be any kind of random access memory ("RAM") or read only memory ("ROM"). In the illustrated embodiment, the memory 515 is ROM. The processor 510 communicates with the memory 515 over line 520. On the memory 515 resides a set of instructions 525 and a set of values 530. When the device on which the driver circuit 200 and opts-electronic device 205 are fabricated is powered on, the processor 510 fetches and executes the instructions 525. Executing the instructions causes the processor 510 to fetch the values 530 and load them into the registers 535 (only one indicated) over the line 520.

The examples shown in FIG. 5A and FIG. 5B are but two examples of how the control signals Cp_ctl[x:y], Cn_ctl[x:y] may be programmed in various implementations of the subject matter claimed below. Those in the art having the benefit of the disclosure herein will appreciate alternative ways in which the programming may be implemented. For example, this functionality may alternatively be implemented in an appropriately programmed EEPROM or an Application Specific Integrated Circuit ("ASIC"). Thus, in other examples, the programming of the control signals Cp_ctl[x:y], Cn_ctl[x:y] may be implemented in other ways including, but not limited to, other means having structure equivalent to those disclosed herein that perform the disclosed functionality.

Similarly, the implementations of the pull-up circuit 150, 220 and the pull-down circuit 120, 225 disclosed herein in FIG. 1 and FIG. 2-FIG. 3 and discussed in associated text are merely examples of how the associated functionality may be, implemented. Other examples may choose other implementations within the scope and spirit of that which is claimed below. Thus, in other examples, the pull-up circuit 220 and the pull-down circuit 225 may be implemented in other ways including, but not limited to, other means having structure equivalent to those disclosed herein that perform the disclosed functionality.

Figure 6A:
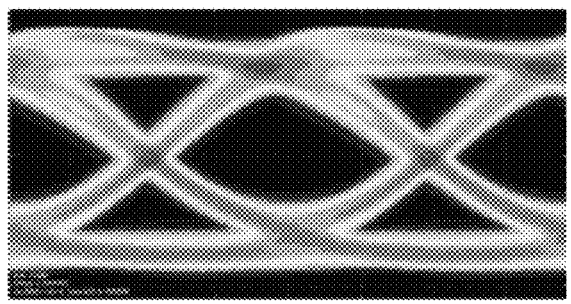
FIG. 6A and FIG. 6B are eye diagrams illustrating the efficacy of the pull-down circuit in FIG. 3.
Figure 6B:
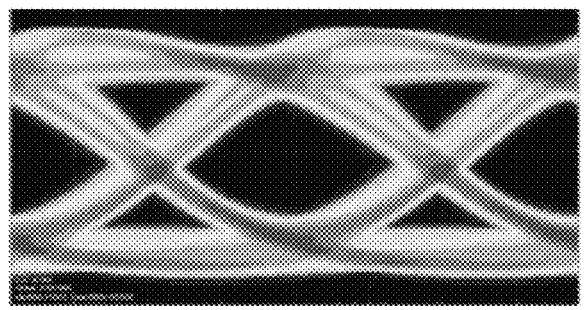

FIG. 6A and FIG. 6B are eye diagrams of the output signal of the opto-electronic device 205 illustrating the efficacy of the pull-down circuit 225 in FIG. 3 with two settings. The eye diagram of FIG. 6A was generated with Cp_ctl=[0:0] and Cn_ctl=[0:0] (i.e., symmetric driving of the opto-electronic device). The eye diagram of FIG. 6B was generated with Cp_ctl=[1:1] and Cn_ctl=0 (i.e., asymmetric driving). The eye height is improved by 13%, thereby indicating an improved performance.

Figure 7A:
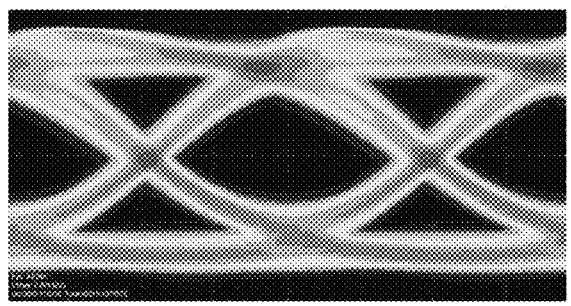
FIG. 7A and FIG. 7B are eye diagrams illustrating the efficacy of the pull-up circuit in FIG. 4.
Figure 7B:
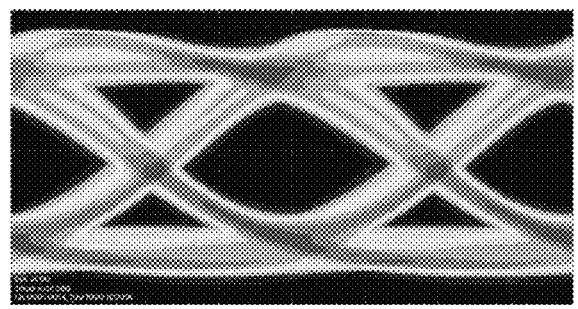

FIG. 7A and FIG. 7B are eye diagrams of the output signal of the opto-electronic device 205 illustrating the efficacy of the pull-up circuit 220 in FIG. 4 with two settings. The eye diagram of FIG. 7A was generated with Cp_ctl=[0:0] and Cn_ctl=[0:0] (i.e., symmetric driving of the opto-electronic device). The eye diagram of FIG. 7B was generated with Cp_ctl=[1:1] and Cn_ctl=0 (i.e., asymmetric driving). The eye height is improved by 13%, thereby indicating an improved performance.

Figure 8:
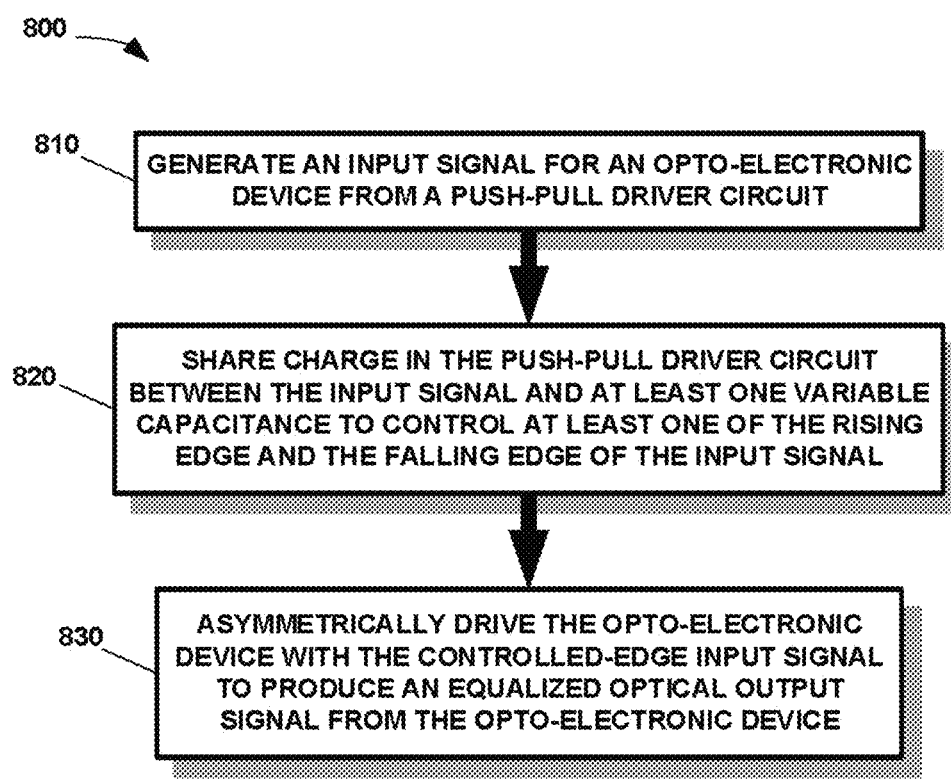
FIG. 8 is a flow chart illustrating a method as practiced in accordance with one or more examples of the subject matter claimed below.

FIG. 8 is a flowchart depicting a method 800 as practiced in accordance with one or more examples of the subject matter claimed below. The method 800 begins by generating (at 810) an input signal for an opto-electronic device from a push-pull driver circuit. Next, charge is shared (at 820) in the push-pull driver circuit between the input signal and at least one variable capacitance capacitor to control at least one of the rising edge rate or the falling edge rate of the input signal. Then, the opto-electronic device is asymmetrically driven (at 830) with the controlled-edge input signal to produce an equalized optical output signal from the opto-electronic device.

This concludes the detailed description. The particular examples disclosed above are illustrative only, as examples described herein may be modified and practiced in different but equivalent manners apparent to those skilled in the art having the benefit, of the teachings herein. Furthermore, no limitations are intended to the details of construction or design herein shown, other than as described in the claims below. It is therefore evident that the particular examples disclosed above may be altered or modified and all such variations are considered within the scope and spirit of the appended claims. Accordingly, the protection sought herein is as set forth in the claims below. It will be recognized that the terms "comprising" "including," and "having," as used herein, are specifically intended to be read as open-ended terms of art. The term "or," in reference to a list of two or more items, covers all of the following interpretations of the word: any of the items in the list, all of the items in the list, and any combination of the items in the list. As used herein, the terms "connected," "coupled," or any variant thereof means any connection or coupling, either direct or indirect, between two or more elements; the coupling or connection between the elements can be physical (e.g., mechanical), logical, electrical, optical, or a combination thereof.

What is claimed:

1. A push-pull circuit for an opto-electronic device, comprising:
   an output node connected to a common node, wherein an input signal is transmitted over a line from the common node to the output node;
   a pull-up circuit connected to the output node that, in operation, controls a falling edge rate of the input signal to the opto-electronic device while sharing charge with the output node, the pull-up circuit comprising:
      a current source;
      a variable capacitance capacitor in parallel with the current source; and
      a controllable switch in series with the current source and the variable capacitance capacitor to connect and disconnect the current source and the variable capacitance capacitor to and from the output node; and
   a pull-down circuit connected to the output node that, in operation, controls a rising edge rate of the input signal to the opto-electronic device while sharing charge with the output node, the pull-down circuit comprising:
      a current sink;
      a variable capacitance capacitor in parallel with the current sink; and
      a controllable switch in series with the current sink and the variable capacitance capacitor to connect and disconnect the current sink and the variable capacitance capacitor to and from the output node,
   wherein the pull-up circuit and the pull-down circuit is configured to convert the input signal at the output node to an output signal to the opto-electronic device that equalizes the output signal of the electro-optic device based on a difference in the falling edge rate of the input signal caused by the pull-up circuit and the rising edge rate of the input signal by the pull-down circuit.

2. An apparatus comprising:
   an opto-electronic device;
   a driver circuit that, in operation, asymmetrically drives an input signal to the opto-electronic device to equalize output from the electro-optic device, the driver circuit including:
      an output node connected to a common node, wherein the input signal is transmitted over a line from the common node to the output node and the input signal is transmitted to the opto-electronic device through the output node;
      a pull-up circuit connected to the output node including:
         a current source;
         a first variable capacitance capacitor in parallel with the current source; and
         a first controllable switch in series with the current source and the first variable capacitance capacitor to connect and disconnect the current source and the first variable capacitance capacitor to and from the output node, the pull-up circuit sharing charge between the output node and the first variable capacitance capacitor to control the falling edge rate of the input signal to the opto-electronic device when connected to the output node; and
      a pull-down circuit connected to the output node including:
         a current sink;
         a second variable capacitance capacitor in parallel with the current sink; and
         a second controllable switch in series with the current sink and the second variable capacitance capacitor to connect and disconnect the current sink and the second variable capacitance capacitor to and from the output node, the pull-down circuit sharing charge between the output node and the second variable capacitance capacitor to control the rising edge rate of the input signal to the opto-electronic device when connected to the output node,
   wherein the driver circuit asymmetrically drives the input signal based on a difference in the falling edge rate of the input signal caused by the pull-up circuit and the rising edge rate of the input signal by the pull-down circuit at the output node to output an output signal that asymmetrically drives the input signal to the electro-optic device.

3. The apparatus of claim 2, wherein the opto-electronic device is a vertical-cavity surface-emitting laser.

4. The apparatus of claim 2, wherein the driver circuit is a link optical driver.

5. The apparatus of claim 2, wherein at least one of the first variable capacitance capacitor or the second variable capacitance capacitor further comprises:
   a plurality of capacitors arranged in parallel; and
   a plurality of controllable switches, each controllable switch of the plurality of controllable switches being arranged in series with a respective one of the plurality of capacitors and switching the respective one of the plurality of capacitors in and out of the pull-down circuit or the pull-up circuit.

6. The apparatus of claim 5, wherein the plurality of switches are controlled by a programmable signal.

7. The apparatus of claim 6, further comprising means for programming the programmable signal.

8. A method comprising:
   generating an input signal for an opto-electronic device from a push-pull driver circuit;
   sharing charge in the push-pull driver circuit between the input signal and at least one variable capacitance capacitor to control at least one of the rising edge rate or the falling edge rate of the input signal, wherein each of the at least one variable capacitance capacitors is connected to an output node, the output node connected to a source of the input signal; and
   asymmetrically driving the opto-electronic device with the controlled-edge input signal to produce an equalized optical output signal from the opto-electronic device,
   wherein a first variable capacitance capacitor of a push portion of the push-pull driver circuit is in parallel with a current source, and a second variable capacitance capacitor of a pull portion of the push-pull driver circuit is in parallel with a current sink, and
   wherein asymmetrically driving the opto-electronic device with the controlled-edge input signal is based on a difference in the falling edge rate of the input signal and the rising edge rate of the input signal on the output node to output an output signal that equalizes the output of the opto-electric device.

9. The method of claim 8, wherein sharing charge in the push-pull driver circuit includes:

sharing charge between the input signal and the first variable capacitance capacitor in the push portion of the push-pull driver circuit; and sharing charge between the input signal and the second variable capacitance capacitor in the pull portion of the push-pull driver circuit.

10. The method of claim 9, wherein at least one of sharing charge between the input signal and a first variable capacitance and sharing charge between the input signal and the second variable capacitance includes programming a signal to control the variable capacitance of at least one of the first variable capacitance and the second variable capacitance.

11. The method of claim 8, wherein sharing charge in the push-pull driver circuit between the input signal and at least one variable capacitance capacitor to control at least one of the rising edge rate or the falling edge rate of the input signal comprises sharing charge between the input signal at the first variable capacitance capacitor in a pull-up circuit to control the falling edge rate of the input signal.

12. The method of claim 8, wherein sharing charge in the push-pull driver circuit between the input signal and at least one variable capacitance capacitor to control at least one of the rising edge rate or the falling edge rate of the input signal comprises sharing charge between the input signal at the second variable capacitance capacitor in a pull-down circuit to control the rising edge rate of the input signal.

13. The method of claim 8, wherein the at least one variable capacitance capacitor comprises a plurality of capacitors in parallel and the value of the capacitance is controlled by switching the capacitors in and out of the push-pull driver circuit.

14. The method of claim 8, wherein the opto-electronic device comprises a vertical-cavity surface-emitting laser and the push-pull driver circuit comprises a portion of a link optical driver.

\* \* \* \* \*